(12) United States Patent
Nakajima et al.

(10) Patent No.: US 6,897,570 B2
(45) Date of Patent: May 24, 2005

(54) SEMICONDUCTOR DEVICE AND METHOD OF MANUFACTURING SAME (75) Inventors: Takashi Nakajima, Chiyoda (JP); Naotaka Tanaka, Chiyoda (JP); Yasuyuki Nakajima, Tachikawa (JP); Ryo Haruta, Takasaki (JP); Tomoo Matsuzawa, Tokyo (JP); Masashi Sahara, Hitachinaka (JP); Ken Okutani, Tachikawa (JP)

(73) Assignee: Renesas Technology, Corporation, Tokyo (JP)

( * ) Notice: Subject to any disclaimer, the term of this patent is extended or adjusted under 35 U.S.C. 154(b) by 0 days.

(21) Appl. No.: 10/340,307

(22) Filed: Jan. 9, 2003

(65) Prior Publication Data

US 2003/0230809 A1 Dec. 18, 2003

(30) Foreign Application Priority Data

Jan. 11, 2002 (JP) ........................................ 2002-004036

(51) Int. Cl.⁷ ............................................. H01L 29/40

(52) U.S. Cl. .......................... 257/786; 257/773; 257/784
(58) Field of Search .................................. 257/773, 784, 257/786, 750, 758, 700

(56) References Cited

U.S. PATENT DOCUMENTS 6,500,748 B2 * 12/2002 Anand ......................... 438/612

FOREIGN PATENT DOCUMENTS

| JP | 2000-114309 | 4/2000 |
| JP | 2000-269265 | 9/2000 |

* cited by examiner

Primary Examiner—Roy Potter
(74) Attorney, Agent, or Firm—Townsend and Townsend and Crew LLP (57) ABSTRACT A highly reliable semiconductor device provided herein can prevent a junction between a pad and a wire from coming off, and pads from peeling off an underlying insulating layer on the interface thereof. The semiconductor device has plugs formed in a region in which an electrode pad is formed over a substrate. The plugs protrude into the electrode pad.

19 Claims, 7 Drawing Sheets

SEMICONDUCTOR DEVICE AND METHOD OF MANUFACTURING SAME

BACKGROUND OF THE INVENTION

The present invention relates to a semiconductor device, and more particularly, to a semiconductor device which has pads formed on the surface thereof for electric communications to the outside. The present invention also relates to a method of manufacturing the semiconductor device.

The primary importance to the development of large capacity semiconductor devices includes a lower cost and faster operations of the devices through a reduction in chip sizes. Further, in semiconductor devices intended for providing higher performance and more functions, bonding pads (hereinafter simply called the "pads") for electrical connections of a chip to the outside must be formed at a narrower pitch in order to simultaneously increase the number of input/output terminals and reduce the chip size. When 240 pads are formed, for example, along four sides of a chip in the shape of a 5-mm square, each pad must be reduced in width to 70 micrometers or less when the pads are arranged at intervals of 10 micrometers.

On the other hand, due to a reduction in the pad size and an associated reduction in a bonding diameter of a bonding wire (hereinafter simply called the "wire") bonded to a pad, resulting in a localized dynamic load with which a wire is pressed onto a pad, a wire can be bonded to a pad insufficiently depending on bonding conditions, making the wire more prone to falling off, the pad can peel off its underlying insulating layer on the interface therebetween, and a cleavage can run deep into the interior of the semiconductor chip.

To address the foregoing problems, pad structures disclosed in JP-A-2000-269265 and JP-A-2000-114309 comprise a layer made of tungsten or the like having plugs below a pad layer for increasing a bonding strength between the pad layer and wires.

BRIEF SUMMARY OF THE INVENTION

A method of bonding a wire to a pad involves ultrasonically vibrating the wire pressed against the pad with an appropriate load, and diffusing aluminum and gold for bonding. When this method is used with a semiconductor device which is formed with pads of small size so that wires are bonded to the pads with a small bonding diameter, a pad can peel off its underlying insulating layer on the interface therebetween, and a cleavage can run deep into the interior of the semiconductor chip depending on bonding conditions due to a localized load with which a wire is pressed to an associated pad, and a dynamic impact load produced by the ultrasonic vibrations. It is desired to prevent these problems.

However, the above-mentioned prior art examples do not disclose any specific proposals for the prevention.

It is an object of the present invention to provide a highly reliable semiconductor device which is capable of preventing pads from peeling off an underlying insulating layer on the interface therebetween and a cleavage from running deep into the interior of the semiconductor chip, even when wires are bonded to the pads with a bonding diameter of 80 micrometers or less.

A semiconductor device according to one aspect of the present invention includes a semiconductor substrate, a semiconductor circuit formed on the semiconductor substrate, a pad for electric communication to the outside, and a layer having a plug arranged below the pad, wherein the plug has an upper end located higher than a lower end of the pad.

For example, in a semiconductor device formed with a bonding pad to which a bonding wire is bonded with a bonding diameter of 80 micrometers or less, a plurality of dummy plugs may be formed within an interlayer insulating film which is in contact with one side of the bonding pad opposite to the semiconductor substrate. The plugs may protrude into the bonding pad.

"Below" mentioned above refers to the direction toward lower layers. Alternatively, it refers to a direction toward the substrate of the semiconductor device. The upper end refers to an end close to an overlying layer. Alternatively, it may refer to an end of the surface closer to the semiconductor device. The lower end refers to an end close to an underlying layer. Alternatively, it may refer to an end on the inner side of the semiconductor device.

For example, the lower end of the pad at a position corresponding to the upper end of the plug is formed at a position higher than the lower end of the pad in a region positioned therearound.

The plugs are so-called dummy plugs, each of which has one end electrically connected to the pad, but the other end of which may be adjacent to the insulating film (for example, forming a closed circuit electrically connected only to the bonding pad).

A semiconductor device according to another aspect of the present invention includes a semiconductor substrate, a semiconductor circuit formed on the semiconductor substrate, a pad for electric communication to the outside, and a layer having a plug and an insulating film arranged below the pad, wherein the plug has an upper end located higher than an upper end of the insulating film. A plurality of the plugs may be disposed through the insulating film.

For example, the lower end of the pad at the position corresponding to the upper end of the plug is formed at a position higher than the lower end of the pad at the position corresponding to the upper end of the insulating film adjacent to the plug.

In the semiconductor device described above, the plug is formed with the upper end located higher than the lower end of the pad by 30 nanometers or more.

It is also contemplated that the upper end of the plug is located 20 nanometers or more higher than the lower end of the pad, or 10 nanometers or more.

In regard to an upper limit of the upper end, when the pad has the overall length on the order of 400 nm to 1000 nm, the plug may be formed such that its upper end is located, for example, 30 nm to 100 nm higher than the lower end of the pad. In another case, when the plug may be formed such that its upper end is located 20 nm or more higher than the lower end of the pad, the upper end of the plug may be located approximately 150 nm or less higher than the lower end of the pad. Alternatively, the plug may be formed such that its upper end is located 10 nm higher than the lower end of the pad, though not so effective. In this event, the upper end of the plug may be located approximately 200 nm or less higher than the lower end of the pad.

In the semiconductor device described above, a wire is bonded to the pad. The wire has a diameter of 80 micrometers or less at a junction on the pad.

The junction preferably has a diameter of 65 micrometers (±5 micrometers) or less for producing the effect. More preferably, the junction has a diameter of 50 micrometer (±5 micrometers) or less. Since a junction having a smaller diameter makes the pad more prone to peeling, the present invention provides a larger effect when it is implemented in a semiconductor device having bonding pads to which wires are bonded with a smaller diameter of junction.

In the semiconductor device described above, the plug includes at least a first film, and a second film placed below the first film and made of a refractory material, the melting point of which is higher than the first film, wherein the plug protrudes into the pad by a height equal to or more than 50% of the thickness of the second film. "To protrude" relates to a region in which the plug end overlaps the second film in the height direction. The height by which the plug protrudes into the pad can be calculated from the difference in height between the upper end of the plug and the lower end of the second film.

For example, the height by which the plug protrudes into the pad is 50% or more of the thickness of the refractory material film below the pad.

The semiconductor device described above further has a protrusion on the surface of the pad on which communications are made with the outside, corresponding to the position of the plug.

A semiconductor device according to another aspect of the present invention includes a semiconductor substrate, a semiconductor circuit formed on the semiconductor substrate; a pad for electric communication to the outside, and a layer having plugs arranged below the pad, wherein the pad has a shorter side of 90 micrometers or less, and the plugs have upper ends formed at positions 30 nm or more higher than a lower end of the pad.

A semiconductor device according to a further aspect of the present invention includes a semiconductor substrate, an element isolation structure for separating semiconductor elements formed on the semiconductor substrate from each other, a pad in electric communication with the semiconductor element and for electric communication to the outside, a first laminate structure including a layer formed in the element isolation structure and having a first plug, and a first wiring layer formed in a region including a space over the first plug, and a second laminate structure including a layer having at least one second plug on the first laminate structure, and a second wiring layer formed in a region including a space over the second plug, wherein the second plug has an upper end located at a position higher than a lower end of the second wiring layer in the second laminate structure closest to the pad.

A semiconductor device according to a further aspect of the present invention includes a semiconductor substrate, a semiconductor circuit formed on the semiconductor substrate, a pad for electric communication to the outside, and a layer having a plug and an insulating film arranged below the pad, wherein the plug has an upper end located lower than an upper end of the insulating film.

For example, the lower end of the pad at the position corresponding to the upper end of the plug is formed at a position lower than the lower end of the pad at the position corresponding to the upper end of the insulating film adjacent to the plug.

A method of manufacturing a semiconductor device according to another aspect of the present invention includes the steps of forming a semiconductor circuit on a semiconductor substrate, forming an interlayer insulating film on the formed semiconductor circuit, forming a plurality of contact holes through the interlayer insulating film, filling the contact holes with a contact hole material to form plugs therein, planarizing an upper end of the interlayer insulating film including the plugs, etching the upper end of the interlayer insulating film including the plugs such that the plugs have upper ends located higher than the upper end of the interlayer insulating film, and forming an electrode pad on the interlayer insulating film including the plugs for electric communication to the outside.

Each of the plugs forms a barrier film on the interlayer insulating film, for example, a refractory material film, the melting point of which is higher than that of the interior. The contact hole material filled in the contact holes may be, for example, tungsten or the like, and the plugs are formed by a CVD method or the like. The upper end of the interlayer insulating film can be planarized by CMP (chemical mechanical polishing) or the like.

"High" or "upper" mentioned above refers to a position away from the semiconductor substrate or a direction away from the semiconductor substrate.

The present invention provides highly reliable semiconductor devices which can prevent a junction between a pad and a wire from coming off, pads from peeling off an underlying insulating layer on the interface therebetween, a cleavage from running deep into the interior of the semiconductor chip, and other defective bonding between the pad and wire even when the wire is bonded to the pad with a bonding diameter of 80 micrometers or less.

At least one of the aforementioned problems is solved by any of features of the present invention described below or a combination of the features.

The dummy plugs and dummy wiring layers containing a refractory metal excel in tenacity over the interlayer insulating film. With a plurality of stacked structures each comprised of a dummy plug and a dummy wiring layer in contact thereto, even if a crack occurs while a wire is being ultrasonically bonded to a pad, the crack is stopped by the dummy plug or dummy wiring layer, and therefore prevented from running over.

The semiconductor device according to the present invention, which has the foregoing features, significantly improves the reliability of the bonding between pads and wires.

Other objects, features and advantages of the invention will become apparent from the following description of the embodiments of the invention taken in conjunction with the accompanying drawings.

DETAILED DESCRIPTION OF THE INVENTION

Figure 1:
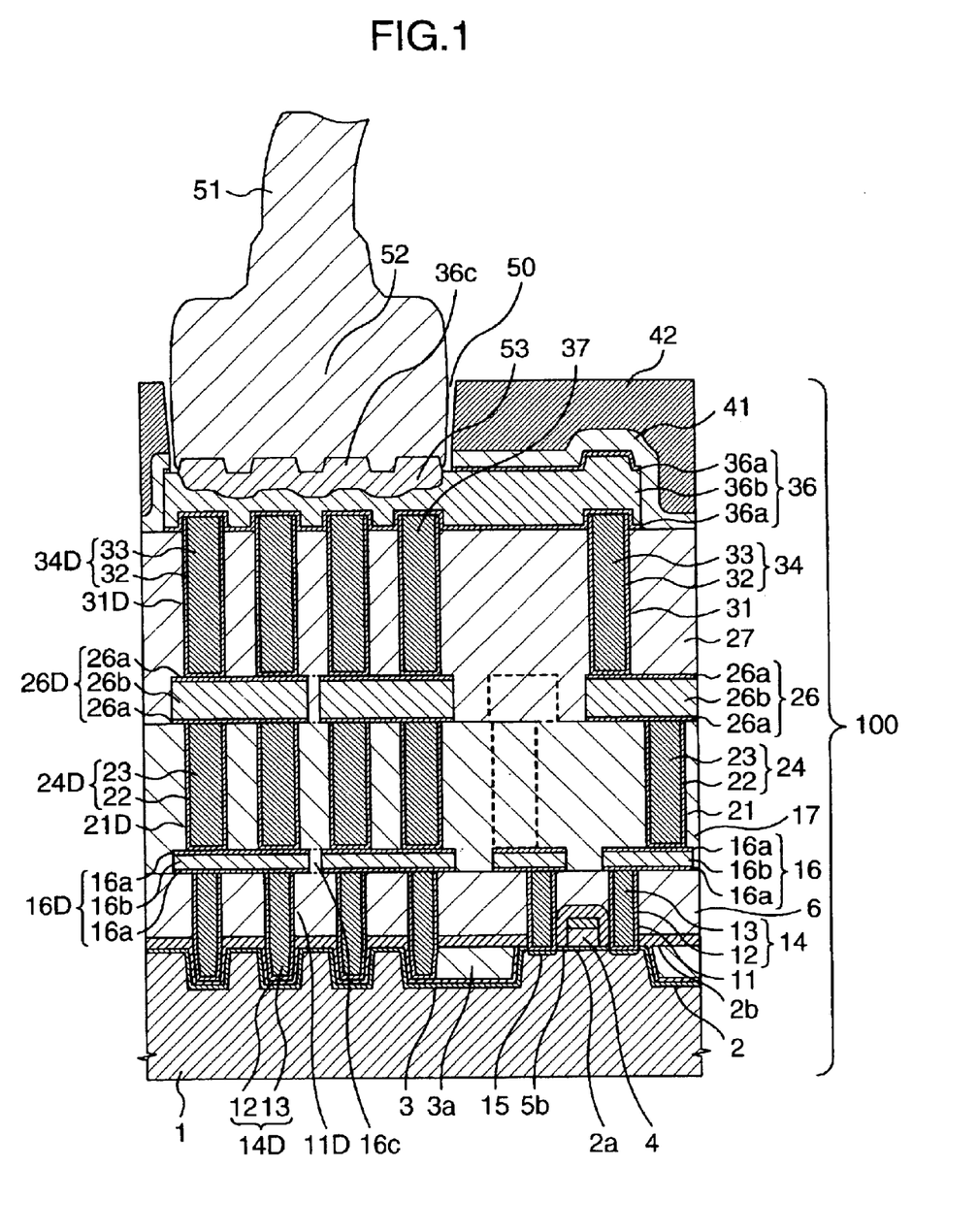
FIG. 1 is a cross-sectional view schematically illustrating a semiconductor device according to one embodiment of the present invention.

A semiconductor device according to one embodiment of the present invention is illustrated in FIG. 1. FIG. 1 is a cross-sectional view schematically illustrating the semiconductor device 100 according to this embodiment, which is applied to a processing unit, by way of example. A pad structure is illustrated in a left-hand region of the drawing, while the structure of a processing circuit is illustrated in a right-hand region.

The semiconductor chip 100 in FIG. 1 comprises a shallow groove feature 3 formed on a silicon substrate 1 for separating elements; and plugs 14D, a first dummy wiring layer 16D, plugs 24D, a second wiring layer 26, plugs 34D, and a third wiring layer 36 which are laminated on the shallow groove feature 3. The third wiring layer 36 additionally serves as a pad. The plugs 34D protrude into the pad 36 by 30 nanometers or more to improve the bonding strength between the pad 36 and an underlying interlayer insulating film 27. While FIG. 1 shows that the plugs 34D alone protrude into the wiring layer or pad 36, each plug formed closer to the semiconductor substrate may be protruded into an overlying wiring layer in contact therewith to increase the rigidity of the entire structure comprised of a plurality of wiring layers and plugs in lamination, resulting in an improved reliability in the bonding between wires and pads.

Typically, a gold bonding wire (hereinafter simply called the "wire") can be bonded to a aluminum alloy pad by ultrasonically vibrating the wire pressed against the pad with an appropriate load to diffuse aluminum and gold for bonding. While this embodiment describes an example in which each of the plugs 34D has its upper end located higher than an upper end of the interlayer insulating film 27 formed between the plug 34D itself and adjacent plugs 34D, the plug 34D may be formed such that its upper end is located below the upper end of the interlayer insulating film 27 formed between the plug 34D itself and the adjacent plugs 34D. In the latter case, the upper end of each plug 34D is preferably lower by 30 nanometers, similar to the foregoing, from the upper end of the interlayer insulating film 27.

Figure 2:
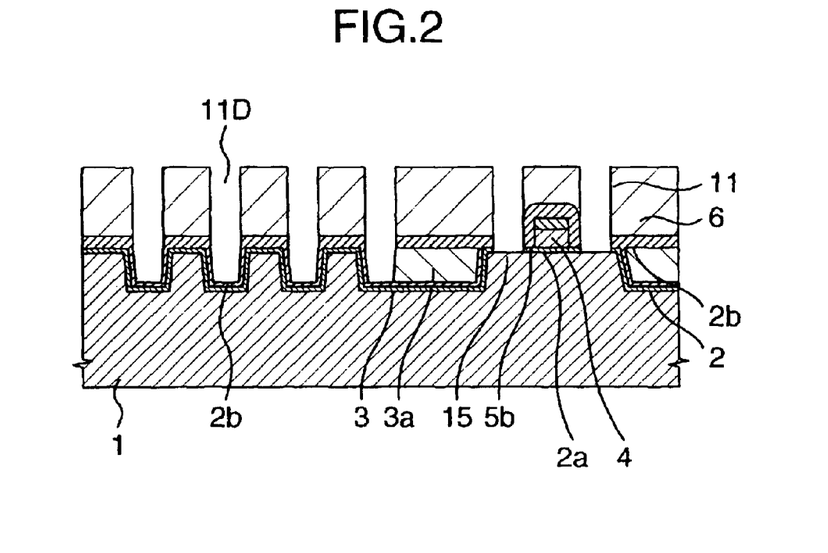
FIG. 2 is a cross-sectional view illustrating a first step in a method of manufacturing the semiconductor device according to one embodiment of the present invention.

FIGS. 2 to 5 are cross-sectional views schematically illustrating steps in the manufacturing of the semiconductor memory according to this embodiment. FIG. 2 schematically illustrates a cross-section of the device in which a MOS (Metal-Oxide-Semiconductor) transistor is formed within a semiconductor substrate 1, an interlayer film 6 is deposited on the silicon substrate 1, contact holes 11 are formed through the interlayer insulating film 6 for electric conduction to the substrate, and dummy throughholes 11D are formed extending into the substrate 1.

Specifically, in the step illustrated in FIG. 2, a shallow groove 3 is formed in the silicon substrate 1 for separating elements. A silicon oxide film 2 is formed on the surface of the silicon substrate 1. A silicon oxide film 3a is embedded in the shallow groove 3. A gate oxide film 2a is formed on the silicon oxide film 2. A gate electrode 4 is formed on the gate oxide film 2a, and silicon nitride films 5a, 5b are formed overlying the gate electrode 4. An impurity is implanted into the silicon substrate 1. After the formation of the interlayer insulating layer 6, the contact holes 11 and dummy throughholes 11D are formed through the interlayer insulating film 6.

Figure 3:
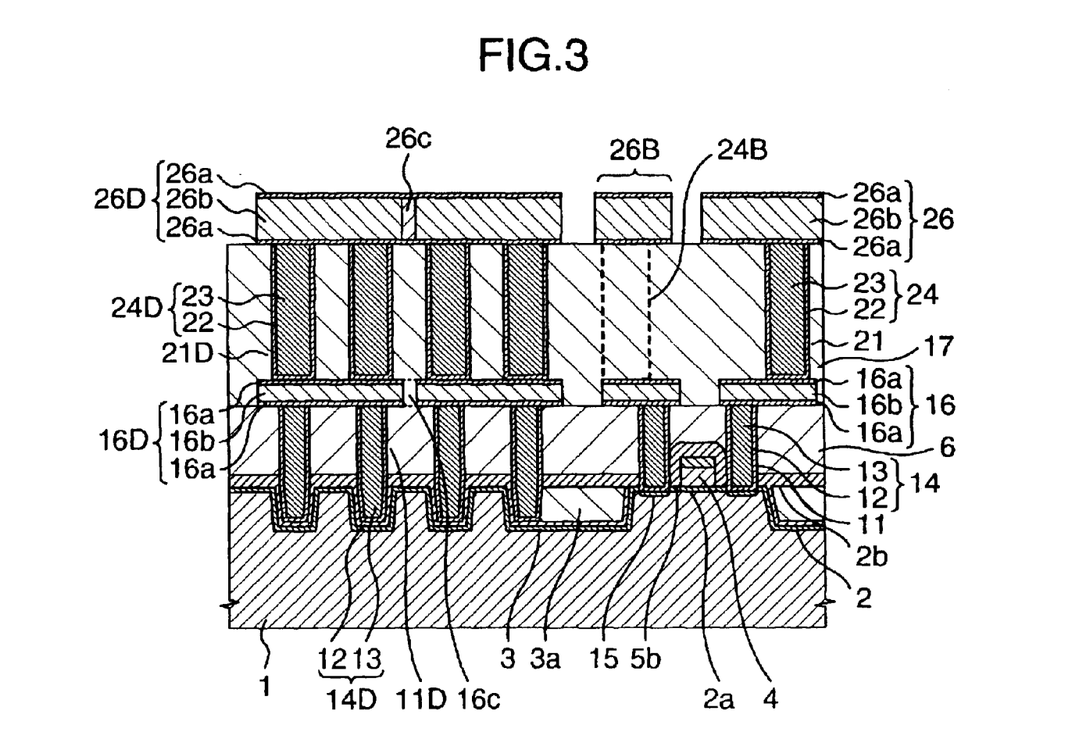
FIG. 3 is a cross-sectional view illustrating a second step in the method of manufacturing the semiconductor device according to the embodiment of the present invention.

Referring next to FIG. 3, a refractory material film 12 is formed in the contact holes 11 and dummy throughholes 11D as a barrier film for preventing heavy metals from diffusing from wires and the like into the silicon substrate 1 and contaminating the same. The refractory material film 12 may comprise, for example, a titanium (Ti) film deposited in a thickness of 20 nm and a titanium nitride (TiN) film deposited in a thickness of 100 nm by a sputtering method or a CVD method in a laminate structure. A silicide layer 15 is formed on the interface between the refractory material film 12 and the silicon substrate 1 and polycrystal silicon plugs 8b by a chemical reaction in a heat treatment step which is later applied. For example, when the refractory material film 12 is made up of a laminate of a Ti film and a TiN film, a titanium silicide layer is formed on the interface. In another example, when the refractory material 12 is made up of a laminate of a cobalt film and a TiN film, a cobalt silicide layer is formed on the interface.

After the formation of the refractory material film 12, a tungsten (hereinafter simply called "W") film 13 is deposited in the contact holes 11 by a chemical vapor deposition (CVD) method so that the W film 13 is embedded therein to form W plugs 14 and dummy W plugs 14D. The refractory material film 12 and W film 13 deposited on the interlayer insulating film 6 are polished by a chemical mechanical polishing (CMP) method so that they are removed except for the W plugs 14, 14D, and the surface of the interlayer insulating film 6 is planarized.

A refractory metal film 16a, an aluminum alloy film 16b, and a refractory metal film 16a are formed on the interlayer insulating film 6 by a sputtering method or a CVD method. The refractory metal film 16a, aluminum alloy film 16b, and refractory metal film 16a on the aluminum alloy film 16b are deposited in thicknesses of 20 nm, 200 nm, and 20 nm, respectively.

In regard to the deposition method, the sputtering method often provides a higher adhesivity to an underlying layer because the sputtering method deposits atoms physically expelled from a target on a wafer. Conversely, for depositing a film within a deep groove, the CVD method is suitable because the CVD method relatively uniformly deposits the film on side faces and bottom face of the groove. Since these deposition methods have both advantages and disadvantages, appropriate films should be deposited to make the most of the respective methods in consideration of the structure of a particular device, stresses of films to be deposited, and the like.

Subsequently, a first wiring layer 16 and a first dummy wiring layer are formed by dry etching, followed by deposition of an interlayer insulating film 17. Then, a throughhole 21 and dummy throughholes 21D are formed through the interlayer insulating film 17 by dry etching. Further, similar to the formation of the plugs 14, 14D and wiring layers 16, 16D, a refractory material film 22 and a W film 23 are embedded in the throughhole 21 and dummy throughholes 21D, and the surface of the interlayer insulating film 17 is planarized by a CMP method. A second wiring layer 26 and a dummy wiring layer 26D are formed on the interlayer insulating film 17. Specifically, a refractory metal film 26a, an aluminum alloy film 26b, and a refractory metal film 26a on the aluminum alloy film 26b are deposited on the interlayer insulating film 17, and dry etched to form the second wiring layer 26 and dummy wiring layer 26D.

A throughhole 24B and a wiring layer 26B indicated by dotted lines are three-dimensionally formed on a cross-section different from the cross-section which illustrates the throughholes 24, 24D and wiring layers 26, 26D. The dummy throughholes 14D, 24D are not formed only in one line as illustrated in the cross-sectional view but are preferably formed in lattice form in conformity to the size of pads.

Next, a third step subsequent to the step illustrated in FIG. 3 will be described with reference to FIG. 4.

After interlayer insulating film 27 is deposited on the wiring layers 26, 26D, a throughhole 31 and dummy throughholes 31D are formed through the interlayer insulating film 27 by dry etching. Similar to the formation of the plugs 24, 24D and wiring layers 26, 26D, a refractory material film 32 and a W film 33 are embedded in the throughhole 31 and dummy throughholes 31D. The surface of the interlayer insulating film 27 (indicated by a dotted line 27B) is planarized by a CMP method. Next, the surface 27B of the interlayer insulating film 27 is etched using an etching method such as wet etching or sputter etching which etches the plugs 34, 34D and interlayer insulating film 27 at different etching rates, to form the structure as illustrated in which the surface of the interlayer insulating film 27 (solid line) is retracted from the plugs 34, 34D, for example, by 30 nanometers or more.

Figure 5:
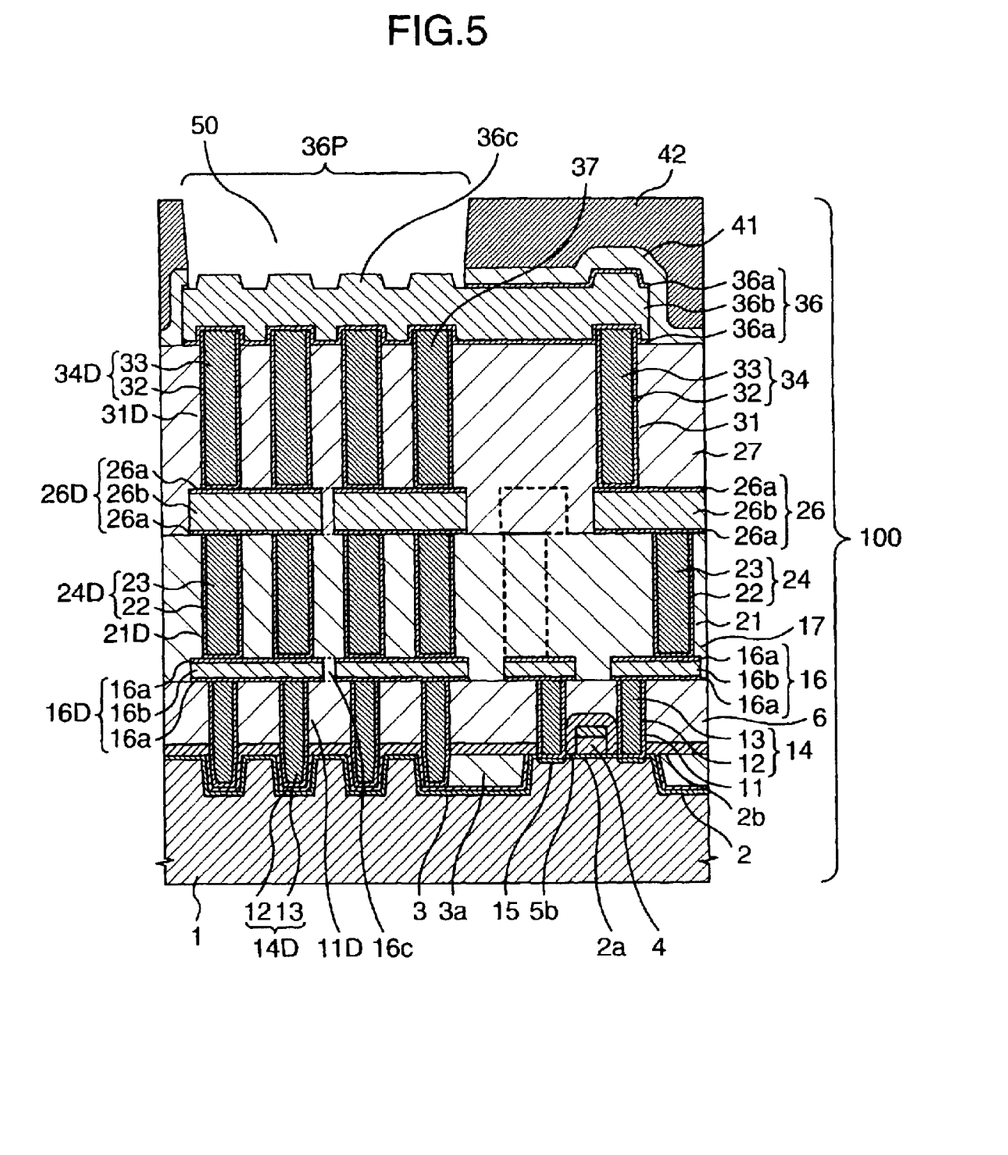
FIG. 5 is a cross-sectional view illustrating a fourth step in the method of manufacturing the semiconductor device according to the embodiment of the present invention.

Next, a fourth step will be described with reference to FIG. 5.

Figure 4:
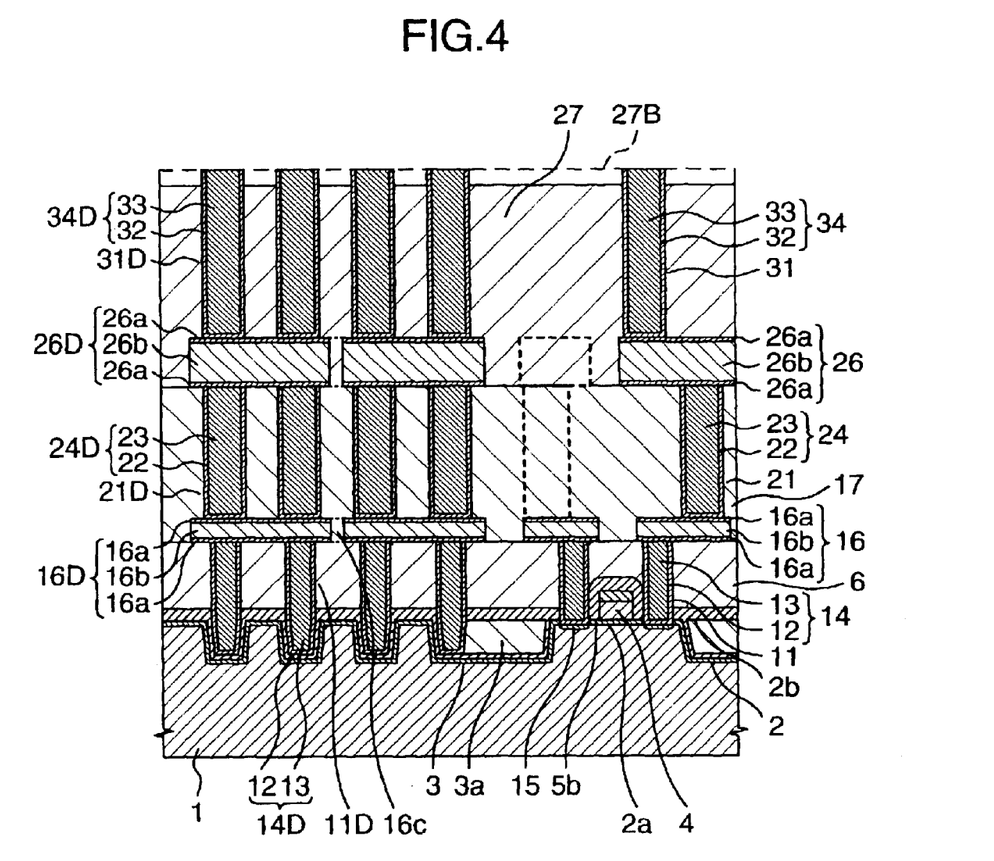
FIG. 4 is a cross-sectional view illustrating a third step in the method of manufacturing the semiconductor device according to the embodiment of the present invention.

A refractory metal film 36a, an aluminum alloy film 36b, and a refractory metal film 36a are deposited on the protruding plugs formed in the step illustrated in FIG. 4 to form a third wiring layer 36 which additionally functions as pads. In a region formed with the plugs 34D having protrusions 37, the third wiring layer 36 has a surface formed with salients conformal to the height of the protruding plugs 34D. An electric circuit pattern and pads are formed on the third wiring layer 36 by dry etching.

A silicon oxide film 41 and a silicon nitride film 42, or an organic film and the like are deposited to form a passivation film for protecting the internal structure of the chip from humidity and the like. The passivation film is etched away from a portion corresponding to a pad 36P to which a wire is connected, to form an opening 50 through which processing signals are inputted and outputted from and to the outside. In this event, the refractory metal film 36a on the surface of the pad 36P is also etched to expose the aluminum alloy film 36b. The aluminum alloy film 36b is formed with protrusions 36c, on the surface thereof, which facilitate plastic deformation on the surface of the pad 36P when a wire connected thereto is ultrasonically vibrated.

The resulting wafer is diced to singulate semiconductor chips 100. Each semiconductor chip 100 is adhered to a die pad on a lead frame for communicating input/output signals from/to the outside. Pads 36P on the semiconductor chip 100 are connected to bonding sites on the lead frame through gold wires 51 for electric connection to the outside through the lead frame.

For wire bonding through ultrasonic vibrations, the leading end of the wire 51 is partially melted into a ball 52 which is ultrasonically vibrated. The ball 52 is slid on the pad 36b to break an oxide film on the surface of the aluminum alloy film 36b by the sliding resistance. Also, frictional heat generated by the ultrasonic vibrations causes gold atoms and aluminum atoms to mutually diffuse from the surface of the aluminum alloy film 36b on which the oxide film is broken to form a gold-aluminum alloy layer 53, thus completing the bonding.

Figure 6:
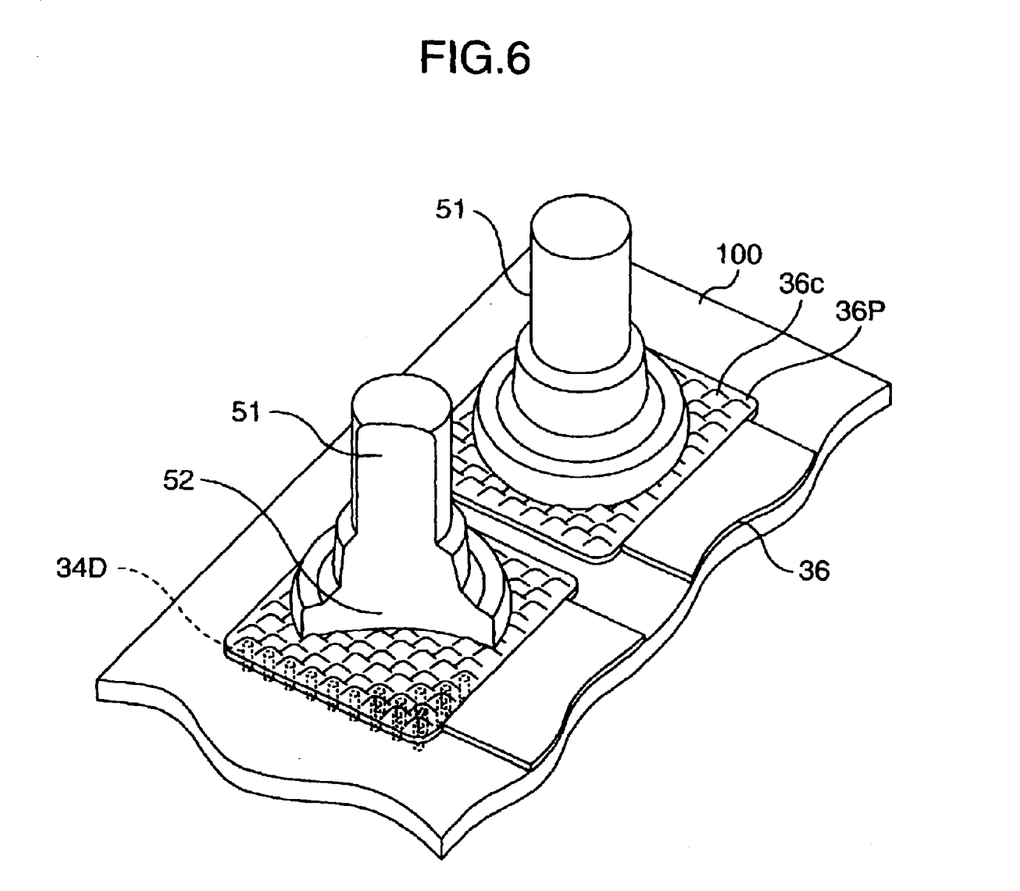
FIG. 6 is a partially sectioned perspective view illustrating a junction of a wire and a pad in the semiconductor device according to the embodiment of the present invention.

FIG. 6 illustrates in partially sectioned perspective view how the gold wire 51 is bonded to the aluminum alloy pad 36P on the semiconductor chip 100. A portion of the gold wire 51 is cut away to make the cross-section visible for readily understanding the profile of the pad 36P. The melted gold ball 52 at the leading end of the wire 51, which is being ultrasonically vibrated, is pressed onto the surface of the pad 36P formed with a large number of protrusions 36c provided by the protruding plugs arranged in lattice. The leading end of the gold wire 51 is slid on the aluminum alloy film 36b to cause plastic deformation, so that the gold ball 52 is collapsed into a flat shape as illustrated, and bonded to the pad 36P.

Since the pad 36P is formed with the protrusions 36c on the surface, the wire 51 can be bonded to the pad 36P with a smaller load and smaller ultrasonic vibration energy. Consequently, it is possible to provide a semiconductor device which has highly reliable wire/pad junctions.

After the wire bonding, the resulting semiconductor chip 100 is finally packaged in the chip size or is entirely encapsulated in a package with a resin filled therein for protecting the semiconductor chip 100 from humidity, ultraviolet rays and the like, thereby completing a semiconductor device according to the present invention.

While the foregoing embodiment has been described in connection with a semiconductor device having three wiring layers, taken as an example, the present invention can be applied as well to semiconductor devices which have less than three or more than three wiring layers. In addition, the present invention can be applied to a semiconductor device which is structured such that solder balls are directly connected without wire bonding. A resulting improvement in the adhesion strength of pads to an underlying insulating film prevents the pads from peeling off due to thermal deformation of solder.

Figure 7:
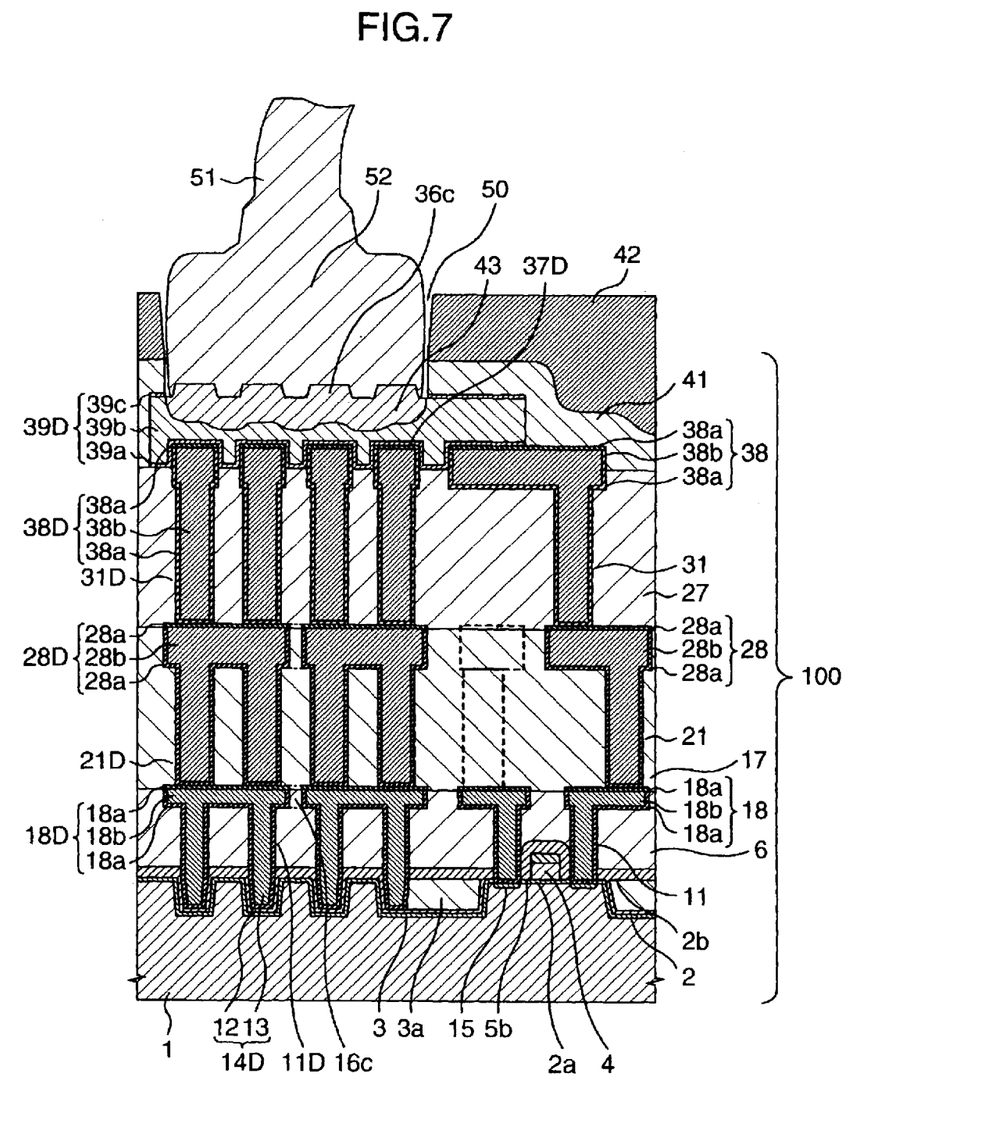
FIG. 7 is a cross-sectional view schematically illustrating a semiconductor device according to another embodiment of the present invention.

FIG. 7 illustrates an exemplary semiconductor device which employs copper for the material of the wiring layers. The illustrated semiconductor device has a Damascene wiring structure which is formed by embedding copper wires and plug structures in holes by plating or the like, instead of wiring layers and plugs.

A first, a second, and a third wiring layer comprise Damascene wires 18, 28, 38, respectively, and are covered with refractory metal films 18a, 28a, 38a, respectively, for preventing copper from diffusing. Laminate structures 18D, 28D, 38D similar to the Damascene wires are formed below a pad over the semiconductor substrate. Preferably, the refractory metal films are mainly composed of ruthenium or platinum.

For bonding a gold wire 51, the interlayer insulating film 27 is first etched back, for example, by 50 nanometers or more, and a wiring layer for electrical connection with the third Damascene copper wire 38, and a pad 39D are formed on the interlayer insulating film 27 because copper does not diffuse and bond to gold at temperatures so low as aluminum. The wiring layer and pad 39D are formed into a circuit pattern by laminating a refractory metal film 39a, an aluminum alloy film 39b, and a refractory metal film 39c, and dry etching these films.

The bondability as before can be ensured by employing an aluminum alloy for the material of the pad to which the wire 51 is bonded.

Figure 8:
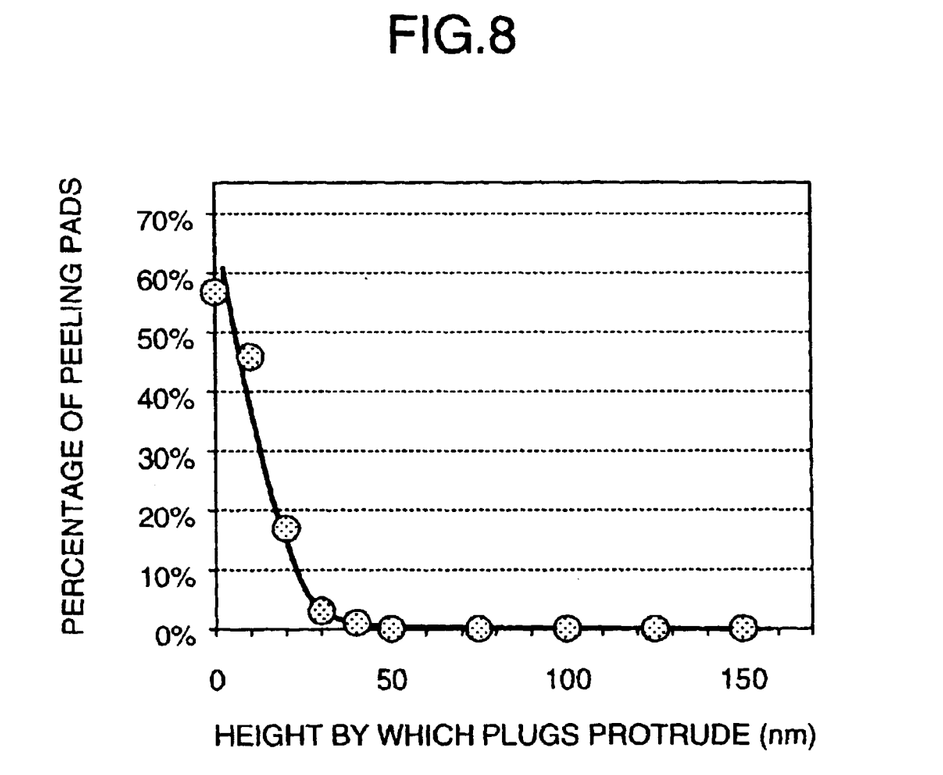
FIG. 8 is a characteristic graph showing the dependency of the percentage of peeling bonding pads to the total number of bonding pads subjected to a tensile test on the height of protruding plugs.

An investigation was made on the dependency on the percentage of the number of bonding pads which peeled off without cutting the wires 51 to the total number of bonding pads 36P, when a tensile load was applied to the ultrasonically bonded wires 51 from bonding pads 36P, while changing the height of the plugs 34D by which they protruded into the bonding pads 36P (height of the protrusions 37).

Testing conditions are shown below:

<Bonding Pad Laminate Structure>

Refractory Metal Film 36a
Material: Titanium Nitride, Thickness: 50 nm
Aluminum Alloy Film 36b
Material: Aluminum - 1% Copper Alloy,
Thickness: 500 nm
<Gold Wire>

Wire Material: Highly Rigid Gold Wire
Wire Diameter: 25 μm
<Wire Bonding Conditions>

Bonding Load: 400 mN
Ultrasonic Frequency: 60 kHz
Temperature of Chip: 200° C.

The result of the tensile test will be described with reference to FIG. 8, where the horizontal axis represents the protruding height of the plugs, and the vertical axis represents the percentage of the number of pads which peeled off to the number of pads subjected to the tensile test. As can be seen from FIG. 8, 50% or more of bonding pads peeled off with the protruding height equal to 0 nm, i.e., when the plugs did not protrude, whereas the percentage of peeling bonding pads suddenly decreased when the pads had the plugs protruding into the bonding pads. The percentage was reduced to 20% or less with the protruding height equal to 20 nm, and to substantially zero with the protruding height equal to 30 nm.

It can be assumed from the foregoing result that bonding pads can be prevented from peeling off when the plugs are formed to protrude by a height of 30 nm or more, and by a height of 20 nm or more when the bonding conditions are corrected such that the bonding pads do not peel off.

In a specific embodiment, when the pad has the overall length on the order of 400 nm to 1000 nm, the plug protrusions may be formed, for example, in a range of 30 nm to 100 nm. In another case, when the plug protrusions have a height of 20 nm or more, the range of the protrusions may be extended to approximately 150 nm or less. Alternatively, the protrusions may have a height of 10 nm or more, though not so effective. In this event, the range of the protrusions may be extended to approximately 200 nm or less.

As appreciated from the foregoing, the present invention can provide highly reliable semiconductor devices which can prevent a junction between a pad and a wire from coming off, pads from peeling off an underlying insulating layer on the interface thereof, a cleavage from running deep into the interior of the semiconductor chip, and other defective bonding between the pad and wire.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
a semiconductor substrate;
a semiconductor circuit formed on said semiconductor substrate;
a pad electrically connected to the semiconductor circuit for electrical communication to circuitry external to the semiconductor device, the pad having a lower surface; and
a layer having a plug arranged below said pad, said plug having an upper end located higher than the lower surface of the pad, thereby providing an interlocking structure between the pad and the plug.

2. A semiconductor device comprising:
a semiconductor substrate;
a semiconductor circuit formed on said semiconductor substrate;
a pad for electric communication to circuitry external to the semiconductor device, the pad being disposed above a layer of insulating material having an upper surface; and
a layer having a plug disposed below said pad, the plug having an upper end located higher than the upper surface of the layer of insulating material to form an interlocking structure with the pad.

3. A semiconductor device according to claim 1, wherein said plug is formed with the upper end located higher than the lower surface of said pad by at least 30 nanometers.

4. A semiconductor device according to claim 1, further comprising a wire bonded to said pad.

5. A semiconductor device according to claim 4, wherein said wire has a diameter of 80 micrometers or less at a junction on said pad.

6. A semiconductor device according to claim 1, wherein said plug includes at least a first film, and a second film placed below said first film comprising a refractory material, the melting point of which is higher than said first film, wherein said plug protrudes into said pad by a height equal to at least 50% of the thickness of said second film.

7. A semiconductor device according to claim 1, further comprising a protrusion on an upper surface of said pad, said protrusion corresponding to the position of said plug.

8. A semiconductor device comprising:
a semiconductor substrate;
a semiconductor circuit formed on said semiconductor substrate;
a pad electrically connected to the semiconductor circuit to enable communication to external devices, the pad having a lower surface; and
a layer having a plug arranged below said pad,
wherein said pad has a thickness of 90 micrometers or less, and said plug has an upper end formed at a position 30 nm or more higher than a lower surface of said pad.

9. A semiconductor device comprising:
a semiconductor substrate;
an element isolation structure for separating semiconductor elements formed on said semiconductor substrate from each other;
a pad in electrical communication with said semiconductor element to provide electrical communication to an exterior of the semiconductor circuit;
a first laminate structure including a layer formed in said element isolation structure and having a first plug, and a first wiring layer formed in a region including a space over said first plug; and
a second laminate structure including a layer having at least one second plug on said first laminate structure, and a second wiring layer formed in a region including a space over said second plug,
wherein said second plug has an upper end located at a position higher than a lower surface of said second wiring layer in said second laminate structure closest to said pad.

10. A semiconductor device comprising:

a semiconductor substrate;

a semiconductor circuit formed on said semiconductor substrate;

a pad for electric communication to the outside; and a layer having a plug and an insulating film arranged below said pad, said plug having an upper end located lower than an upper end of said insulating film.

11. A semiconductor structure as in claim 1 wherein the plug comprises a dummy plug which is electrically connected only to the pad.

12. A semiconductor structure as in claim 11 having a plurality of plugs disposed beneath the pad, each extending above the lower surface of the pad, and each of the plurality is a dummy plug electrically connected only to the pad.

13. A semiconductor structure as in claim 2 wherein the plug comprises a dummy plug which is electrically connected only to the pad.

14. A semiconductor structure as in claim 11 having a plurality of plugs disposed beneath the pad, each extending above the lower surface of the pad, and each of the plurality is a dummy plug electrically connected only to the pad.

15. A semiconductor device comprising:

a semiconductor substrate;

a semiconductor circuit formed on the semiconductor substrate;

a pad having a lower surface, the pad being electrically connected to the semiconductor circuit to enable electrical communication to an external device; and a layer having a plug arranged below the pad, the plug having an upper end located higher by at least 30 nanometers than the lower surface of the pad.

16. A semiconductor device as in claim 15 wherein the pad provides for a wire bonding electrical connection to the semiconductor circuit, and the plug is connected only to the pad.

17. A semiconductor device according to claim 16 wherein a wire having a diameter of less than 80 micrometers is bonded to the pad.

18. A semiconductor device according to claim 15 wherein the plug includes a first film, and further includes a second film below the first film formed from a refractory material having a melting point higher than that of the first film; and the plug protrudes above the lower surface of the pad by an amount which is at least 50% of the thickness of the second film.

19. A semiconductor device according to claim 1 further comprising a protrusion on the surface of the pad, the protrusion corresponding to the position of the plug.

* * * * *